(12) United States Patent
Suetsugu et al.

(10) Patent No.: US 11,988,699 B2
(45) Date of Patent: May 21, 2024

(54) RELATED INTERFERENCE WAVE PRESENTATION DEVICE AND METHOD

(71) Applicant: TOYO Corporation, Tokyo (JP)

(72) Inventors: Kentaro Suetsugu, Tokyo (JP); Congbing Li, Tokyo (JP); Tetsuya Nakamura, Tokyo (JP)

(73) Assignee: TOYO Corporation, Tokyo (JP)

( * ) Notice: Subject to any disclaimer, the term of this patent is extended or adjusted under 35 U.S.C. 154(b) by 218 days.

(21) Appl. No.: 17/552,568

(22) Filed: Dec. 16, 2021

(65) Prior Publication Data

US 2022/0107348 A1    Apr. 7, 2022

Related U.S. Application Data

(63) Continuation of application No. PCT/JP2019/026223, filed on Jul. 2, 2019.

(51) Int. Cl.
*G01R 29/08* (2006.01)
*H04B 17/345* (2015.01)
*H04B 17/391* (2015.01)

(52) U.S. Cl.
CPC ..... *G01R 29/0835* (2013.01); *G01R 29/0871* (2013.01); *H04B 17/345* (2015.01); *G01R 29/0892* (2013.01); *H04B 17/3912* (2015.01)

(58) Field of Classification Search
CPC .... G01R 29/00; G01R 29/08; G01R 29/0807; G01R 29/0814; G01R 29/0821;

(Continued)

(56) References Cited

U.S. PATENT DOCUMENTS

2012/0021710 A1   1/2012   Tsukamoto et al.
2015/0293162 A1   10/2015  Tsukamoto et al.

FOREIGN PATENT DOCUMENTS

CN   101155169 B  *  2/2012   ........... H04B 17/345
CN   102841381 A  *  12/2012  ............... G01V 1/36

(Continued)

OTHER PUBLICATIONS

International Search Report and Written Opinion of the International Searching Authority issued by Japan Patent Office for corresponding International Patent Application No. PCT/JP2019/026223, mailed on Aug. 27, 2019, with a partial English translation.

*Primary Examiner* — Hoai-An D. Nguyen
(74) *Attorney, Agent, or Firm* — Myers Wolin, LLC

(57) ABSTRACT

A related interference wave presentation device includes a class specifying processer circuitry configured to specify a class to which a reference interference wave, which is a referenced interference wave, belongs, using a learned model generated by machine learning of sample data including interference waves to specify a class to which an interference wave belongs based on feature values of the interference wave, a related interference wave information generator configured to retrieve the sample data based on the class to which the reference interference wave belongs and generate related interference wave information which is information about a related interference wave; and a presentation controller configured to perform control to present the related interference wave information in part or in whole.

17 Claims, 15 Drawing Sheets

(58) Field of Classification Search
CPC ............ G01R 29/0828; G01R 29/0835; G01R 29/0864; G01R 29/0871; G01R 29/0892; H04B 17/00; H04B 17/30; H04B 17/309; H04B 17/345; H04B 17/391; H04B 17/3912; H04B 17/3913
USPC ...................................... 324/76.11, 144, 146
See application file for complete search history.

(56) References Cited

FOREIGN PATENT DOCUMENTS

| | | | | |
|---|---|---|---|---|
| JP | H0993155 A | * | 4/1997 | ............... H04B 1/40 |
| JP | 2012-47724 A | | 3/2012 | |
| JP | 2012-118017 A | | 6/2012 | |
| JP | 2016-156641 A | | 9/2016 | |
| JP | 6505348 B1 | | 4/2019 | |
| WO | 2014/065032 A1 | | 5/2014 | |

* cited by examiner

FIG. 15

INPUT RETRIEVAL CONDITIONS SUCH AS PRODUCT NAME AND COMMENT

MODEL == "x098" & OPERATION MODE == "22uu"

RETRIEVAL

| FILE NAME | MEASUREMENT DATE AND TIME | MODEL | OPERATION MODEL | EVALUATION PURPOSE | FILE COMMENT |
|---|---|---|---|---|---|
| ABCD | 30 March, 2019 18:52 | x098 | 22uu | P | |
| EFGH | 30 March, 2019 09:22 | x098 | 22uu | Q | |
| IJKL | 29 March, 2019 17:14 | x098 | 22uu | R | |

RELATED INTERFERENCE WAVE PRESENTATION DEVICE AND METHOD

CROSS-REFERENCE TO RELATED APPLICATION

This application is a continuation application of International Application PCT/JP2019/026223 filed on Jul. 2, 2019 and designated the U.S., the entire contents of which are incorporated herein by reference.

TECHNICAL FIELD

The present disclosure relates to the field of measures against electromagnetic interference (EMI) of electronic devices, etc., and more particularly, to devices, etc., for assisting taking measures against interference wave of electronic devices, etc.

BACKGROUND ART

Electromagnetic waves emitted by an electronic device or the like may cause electromagnetic interference (EMI) that disturbs the functions of other electronic devices. Therefore, taking measures against interference wave (electromagnetic noise) for electronic devices are required to allow the electronic devices to operate properly without malfunction or failure.

The measures against interference wave have been conventionally performed by an operator's observation of a frequency spectrum, time series data or the like that is obtained using a predetermined measurement system (for example, see Patent Literature 1) in an anechoic chamber or the like. That is, for example, the operator observes a waveform of a target frequency spectrum or the like and specifies an interference wave portion, estimates a cause of an interference wave based on the comparison with experiences or past data, and takes measures according to the cause.

CITATION LIST

Patent Literature

Patent Literature 1: Japanese Patent No. 6505348

SUMMARY

Technical Problem

However, in a conventional method of estimating a cause of an interference wave, the accuracy and efficiency of cause estimation vary widely depending on the level of proficiency or skill of the operator.

In recent years, along with a trend toward high density of electronic devices, it has become difficult to specify the cause of interference waves (electromagnetic noise), which causes increases in time and cost to take the measures. Hence, it has been desired to improve the work efficiency.

The present disclosure is made in view of the foregoing technical background, and an object of the present disclosure is to provide a technology that allows an operator engaging in interference wave measures to specify a cause of an interference wave efficiently regardless of the level of proficiency or skill of the operator, and to reduce an operator workload in specifying the cause of the interference wave.

Still other objects and operational effects of the present disclosure are easily understood by those skilled in the art by referring to the following description of the specification.

Solution to Problem

The above-described technical problem can be solved by a related interference wave presentation device, a method, a program and a system having the following configurations.

That is, a related interference wave presentation device according to the present disclosure comprises a class specifying unit configured to specify a class to which a reference interference wave, which is a referenced interference wave, belongs, using a learned model generated by machine learning of sample data including interference waves to specify a class to which an interference wave belongs based on feature values of the interference wave, a related interference wave information generating unit configured to retrieve the sample data based on the class to which the reference interference wave belongs and generate related interference wave information which is information about a related interference wave, and a presentation control unit configured to perform control to present the related interference wave information in part or in whole.

According to such a configuration, the interference wave information related to the referenced interference wave can be generated and presented using the learned model generated by machine learning. Accordingly, the past related interference wave can be presented to an operator regardless of the level of proficiency or skill of the operator. Since the sample data is automatically retrieved based on the referenced interference wave, the operator can perform the work of specifying the cause efficiently. That is, it is possible to reduce an operator workload in specifying the cause of the interference wave.

Here, the presentation includes, for example, an image display on a display device such as a display, an audio output from a speaker, and the like, and the form of the presentation is not limited. The term "interference wave" includes all types of electromagnetic waves which may interfere with the operations of other devices and appliances.

The reference interference wave may be a specific waveform portion in a frequency spectrum.

The specific waveform portion may be a peak waveform portion.

The peak wave portion is referred to as a waveform portion having an amplitude larger by a predetermined value or more or outstandingly larger than neighboring amplitudes in the frequency spectrum.

The machine learning method may be a predetermined clustering method.

The clustering method may be k-means clustering.

The class specifying unit may be configured to specify a class to which the reference interference wave belongs using the k-nearest neighbor algorithm based on a learned model generated by machine learning of the sample data using the k-means clustering and the reference interference wave.

The feature values may include frequency domain feature values which are feature values in a frequency domain and time domain feature values which are feature values in a time domain.

The frequency domain feature values may include at least a peak frequency of one peak waveform portion in a frequency spectrum, and a pair of lower and higher frequencies corresponding to a level lower by a predetermined value than a level corresponding to the peak frequency.

The pair of lower and higher frequencies may be a pair of lower and higher frequencies corresponding to different levels lower than the level corresponding to the peak frequency.

The time domain feature values may include feature values regarding an on level which is a rising level continuing for a predetermined time period and feature values regarding an off level which is a level in other time sections, in a time domain waveform corresponding to a peak frequency at one peak waveform portion in a frequency spectrum.

The time domain feature values may include a maximum level of the on level, a minimum level of the off level, a level difference between the maximum level and the minimum level, an average value at the on level, an average value at the off level, a level difference between the on level average value and the off level average value, a total time period of the on level state, a total time period of the off level state, and a ratio of the total time period of the on level state to the total time period of the off level state.

The related interference wave information may further include associated information regarding an interference wave.

The associated information may be information regarding a component in which the interference wave is generated.

The associated information may be information about measures against the interference wave.

The related interference wave presentation device may further comprise a reference frequency spectrum display control unit configured to control display of a reference frequency spectrum including the reference interference wave, a frequency range acquiring unit configured to acquire information regarding specification of a predetermined frequency range in the reference frequency spectrum, and an interference-wave-in-frequency-range information generating unit configured to retrieve sample data in the frequency range based on the information regarding the specification of the frequency range and generate information regarding an interference wave included in the frequency range.

The related interference wave presentation device may further comprise a similarity retrieval unit configured to retrieve, from the sample data, a frequency spectrum similar to a referenced frequency spectrum based on a predetermined similarity calculation algorithm.

The similarity calculation algorithm may be an algorithm for calculating similarity between class sequence to which interference waves included in a referenced frequency spectrum belong and class sequence to which interference waves in each frequency spectrum according to the sample data belong.

The similarity calculation algorithm may be calculated based on a correlation coefficient between a referenced frequency spectrum and the frequency spectrum to be compared.

The related interference wave presentation device may further comprise a keyword input accepting unit configured to accept an input of a keyword, and a keyword retrieval unit configured to retrieve, from the sample data, related data based on the input keyword.

The present disclosure can be conceived as a method. That is, a related interference wave presentation method according to the present disclosure comprises a class specifying step of specifying a class to which a reference interference wave, which is a referenced interference wave, belongs, using a learned model generated by machine learning of sample data including interference waves to specify a class to which an interference wave belongs based on feature values of the interference wave, a related interference wave information generating step of retrieving the sample data based on the class to which the reference interference wave belongs and generating related interference wave information which is information about a related interference wave, and a presentation control step of performing control to present the related interference wave information in part or in whole.

The present disclosure can be conceived as a computer program. That is, a related interference wave presentation program according to the present disclosure comprises a class specifying step of specifying a class to which a reference interference wave, which is a referenced interference wave, belongs, using a learned model generated by machine learning of sample data including interference waves to specify a class to which an interference wave belongs based on feature values of the interference wave, a related interference wave information generating step of retrieving the sample data based on the class to which the reference interference wave belongs and generating related interference wave information which is information about a related interference wave, and a presentation control step of performing control to present the related interference wave information in part or in whole.

The present disclosure can be conceived as a system. That is, a related interference wave presentation system according to the present disclosure comprises a class specifying unit configured to specify a class to which a reference interference wave, which is a referenced interference wave, belongs, using a learned model generated by machine learning of sample data including interference waves to specify a class to which an interference wave belongs based on feature values of the interference wave, a related interference wave information generating unit configured to retrieve the sample data based on the class to which the reference interference wave belongs and generate related interference wave information which is information about a related interference wave, and a presentation control unit configured to perform control to present the related interference wave information in part or in whole.

Advantageous Effect

According to the present disclosure, it is possible to provide with devices that reduce a workload in specifying a cause of an interference wave.

BRIEF DESCRIPTION OF DRAWINGS

FIG. 15 is an example of a screen view regarding the keyword retrieval mode.

DESCRIPTION OF EMBODIMENTS

Hereinafter, an embodiment of a related interference wave presentation device, a method, a program, and a system according to the present disclosure will be described in detail with reference to the accompanying drawings.

1. First Embodiment

<1.1 Hardware Configuration>

Figure 1:
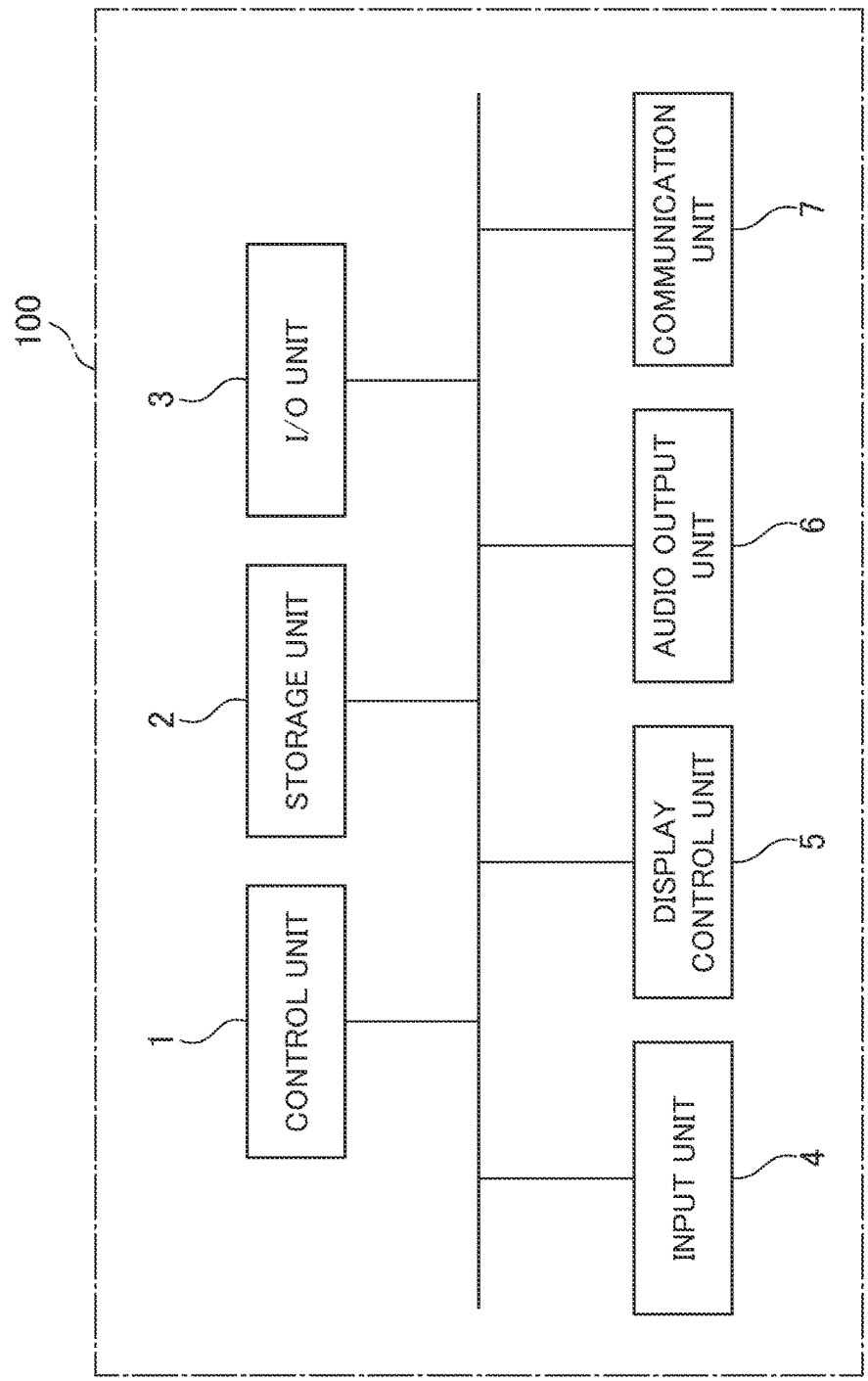
FIG. 1 is a hardware configuration diagram of a related interference wave presentation device.

Firstly, a hardware configuration of a related interference wave presentation device 100 according to the present disclosure will be described. FIG. 1 illustrates a hardware configuration diagram of the related interference wave presentation device 100. As apparent from the figure, the related interference wave presentation device 100 according to the present embodiment includes a control unit 1, a storage unit 2, an I/O unit 3, an input unit 4, a display control unit 5, an audio output unit 6, and a communication unit 7, and the units are connected to one another through buses or the like.

The control unit 1 is a control device including a CPU and/or a GPU. The storage unit 2 is a storage device including a ROM, a RAM, a hard disk, a flash memory, etc., and is configured to store various pieces of information which will be described later. The I/O unit 3 is an input and output interface with an external device. The input unit 4 is configured to perform a process regarding an input from a keyboard or the like connected to the related interference wave presentation device 100. The display control unit 5 is connected to a display or the like (not illustrated), and is configured to perform a display control of an image or the like to be displayed. The audio output unit 6 is connected to a speaker or the like (not illustrated), and is configured to perform an audio output process. The communication unit 7 is a communication unit for performing wired or wireless communication according to a predetermined standard.

<1.2 Operation>

Next, the operation of the related interference wave presentation device 100 according to the present disclosure will be described.

Figure 2:
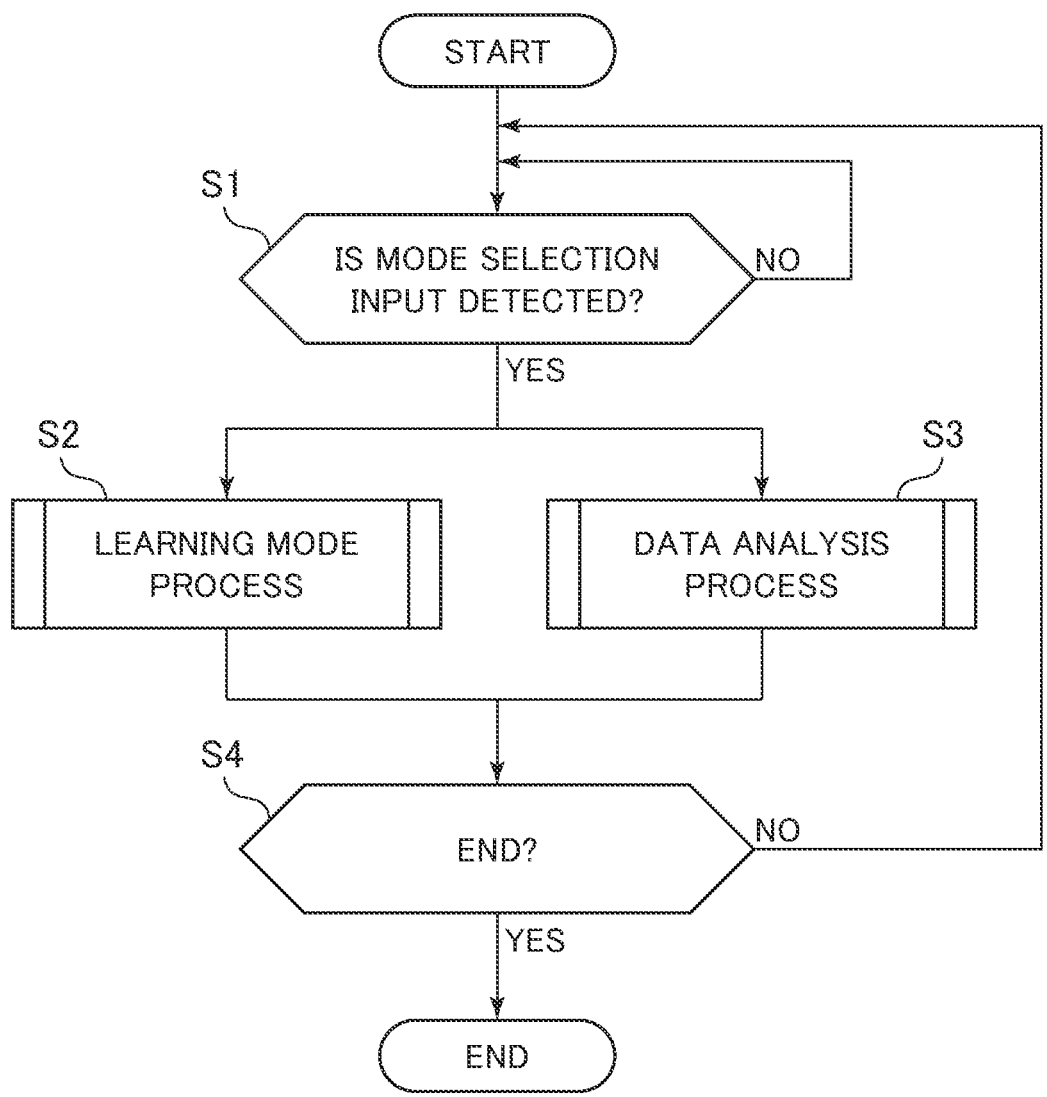
FIG. 2 is a general flowchart of an analysis program.

FIG. 2 is a general flowchart of an interference wave analysis program. As apparent from the figure, when an interference wave analysis program stored in advance in the storage unit 2 is executed, the process starts, and enters a detection standby state of a mode selection input (NO in S1). When in the standby state to detect the mode selection input, a predetermined selection signal is detected through the input unit 4 (YES in S1), a mode process according to a selection signal is executed out of a learning mode process (S2) and a data analysis process (S3). Thereafter, when either mode process is completed, a predetermined end determination process is performed. When a result of the end determination indicates that the process has not ended yet (NO in S4), the process enters the detection standby state of the mode selection input again (NO in S1). On the other hand, the result of the end determination is determined as "end" (YES in S4), the process ends.

<1.2.1 Learning Mode>

Figure 3:
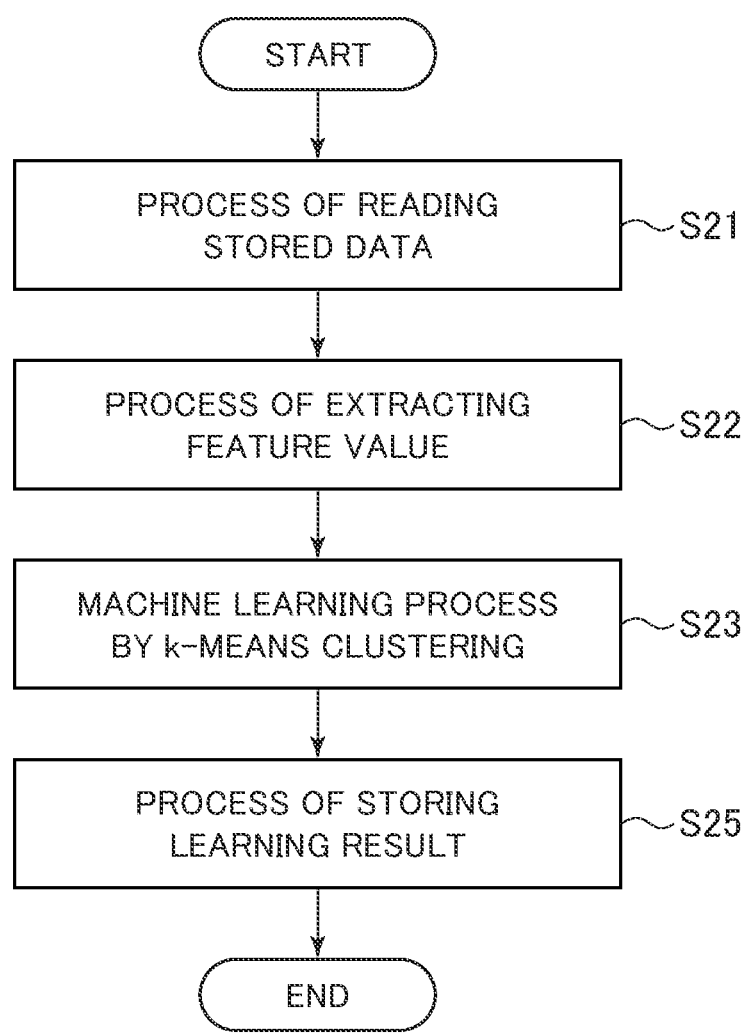
FIG. 3 is a detailed flowchart of a learning mode process.

FIG. 3 is a detailed flowchart of the learning mode process (S2). As apparent from the figure, when the process starts, sample data, i.e., frequency domain data and time domain data including interference waves are read (S21), the sample data being stored in the storage unit 2 and being acquired by measuring various targets under various conditions. Next, there is performed a process of extracting a portion corresponding to an interference wave from the read frequency domain data and time domain data, and extracting feature values from the portion corresponding to the interference wave (S22). In the present embodiment, the portion corresponding to the interference wave is defined as a peak waveform portion having an amplitude larger by a predetermined value or more or outstandingly larger than neighboring amplitudes in the frequency spectrum.

Figure 9:
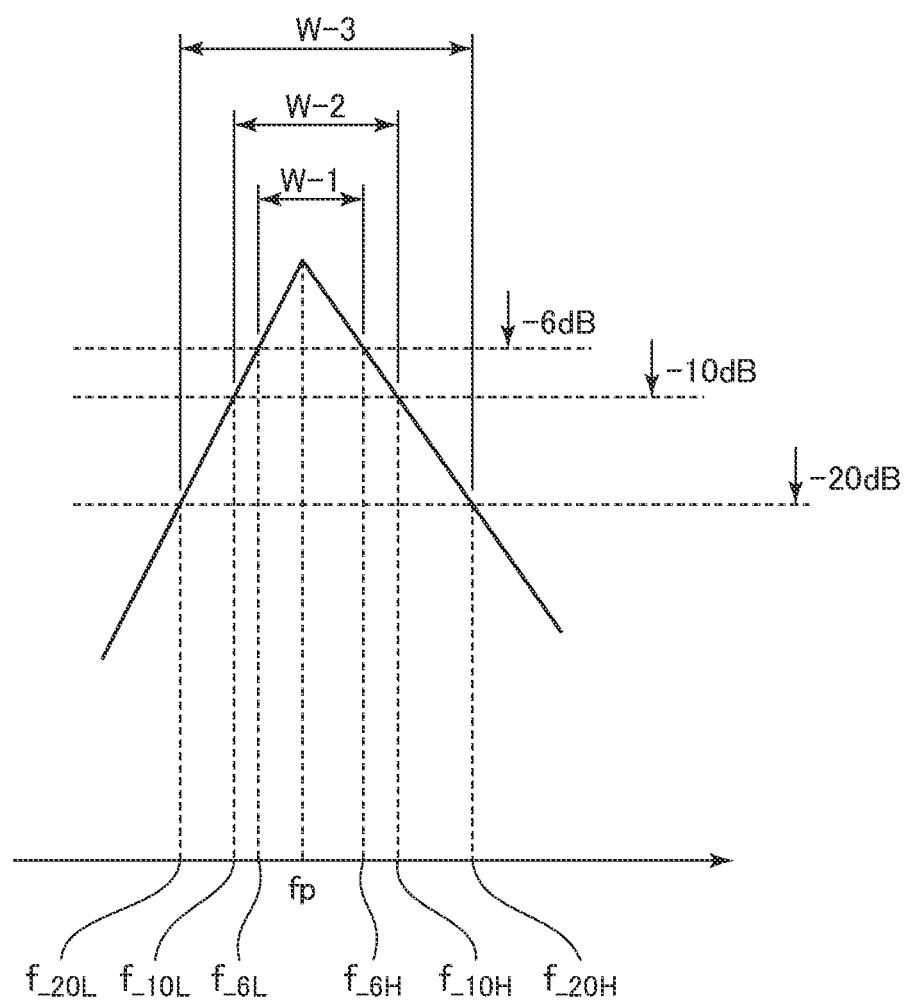
FIG. 9 is an explanatory diagram regarding frequency domain feature values.

In the present embodiment, the feature values include frequency domain feature values and time domain feature values. More specifically, as illustrated in FIG. 9, the frequency domain feature values consist of 10 feature values including a peak frequency (fp) of a peak waveform portion, a pair of lower and higher frequencies ($f_{-6L}$, $f_{-6H}$) corresponding to a level lower by 6 dB than a level corresponding to the peak frequency and a width (W-1) between the lower and higher frequencies, a pair of lower and higher frequencies ($f_{-10L}$, $f_{-10H}$) corresponding to a level lower by 10 dB than a level corresponding to the peak frequency and a width (W-2) between the lower and higher frequencies, and a pair of lower and higher frequencies ($f_{-20L}$, $f_{-20H}$) corresponding to a level lower by 20 dB than a level corresponding to the peak frequency and a width (W-3) between the lower and higher frequencies.

Figure 10:
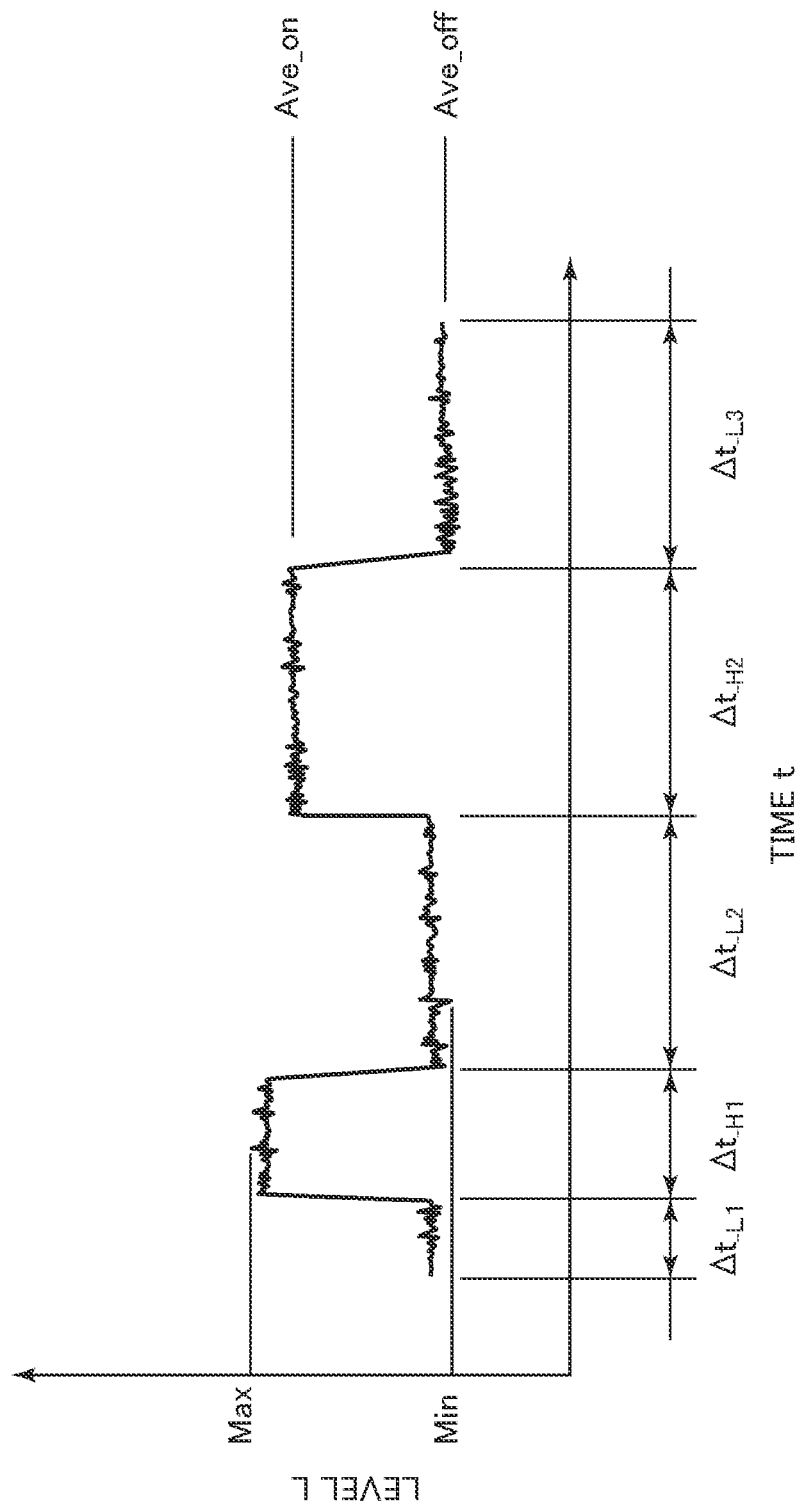
FIG. 10 is an explanatory diagram regarding time domain feature values.

On the other hand, as illustrated in FIG. 10, the time domain feature values consist of nine feature values including a minimum value (Min) and a maximum value (Max) of a waveform in the time domain at the peak frequency, a level variation (Max−Min) which is a difference between the maximum value and the minimum value, an average level (Ave_on) in an on state which is a constant continuous level rising state, an average level (Ave_off) in an off state which is the other normal state, a level difference between the on state and the off state, the sum ($\Delta t_{H1}+\Delta t_{H2}$) of on time widths, the sum ($\Delta t_{L1}+\Delta t_{L2}+\Delta t_{L3}$) of off time widths, and a ratio (($\Delta t_{H1}+\Delta t_{H2}$)/($\Delta t_{L1}+\Delta t_{L2}+\Delta t_{L3}$)) of the sum of on time widths to the sum of off time widths.

After the feature values are extracted from each peak waveform portion, a machine learning process is performed using the k-means clustering (S23). The k-means clustering is a non-hierarchical clustering algorithm, and in the present embodiment, a process of identifying feature values as inputs and classifying the feature values into the predetermined number of classes is repeated by the number of interference waves.

Thereafter, there is performed a process of storing the learned model trained using the k-means clustering in the storage unit 2 (S25), and the process ends.

<1.2.2 Data Analysis Process>

Figure 4:
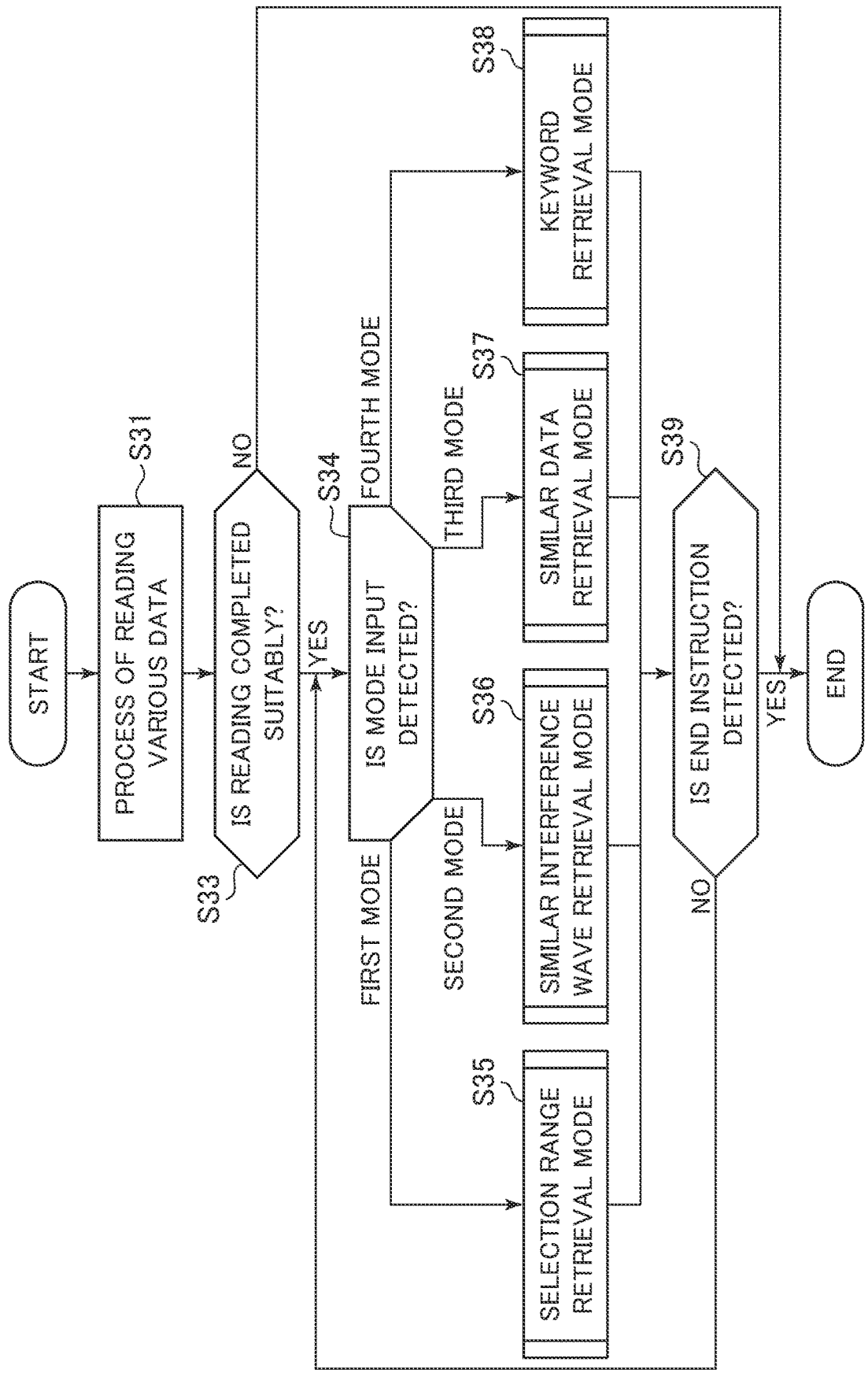
FIG. 4 is a detailed flowchart of a data analysis mode process.

FIG. 4 is a detailed flowchart of the data analysis mode process (S3). As apparent from the figure, when the process starts, a process of reading various types of data is performed (S31). The various types of data include the frequency domain data and time domain data to be analyzed, the learned model, and the like. At this time, the sample data including the interference waves in the frequency domain or the time domain may be also read to perform various processes which will be described later. When a result of the reading indicates that no suitable data exists, the process ends. On the other hand, when the reading process is suitably completed, the process enters a detection standby state of a mode input (S34).

When any one of the first to fourth mode signals is input through the input unit 4, any one of the first to fourth mode processes (S35 to S38) is executed according to the respective mode signals. When each of the mode processes (S35 to S38) is completed, and an end instruction of the data analysis mode process is issued (YES in S39), the process ends. On the other hand, when each of the mode processes (S35 to S38) is completed, and a continuation instruction of the data analysis mode process is issued (NO in S39), the process enters the detection standby state of the mode input again (S34).

<First Mode (Selected Range Retrieval Mode)>

Figure 5:
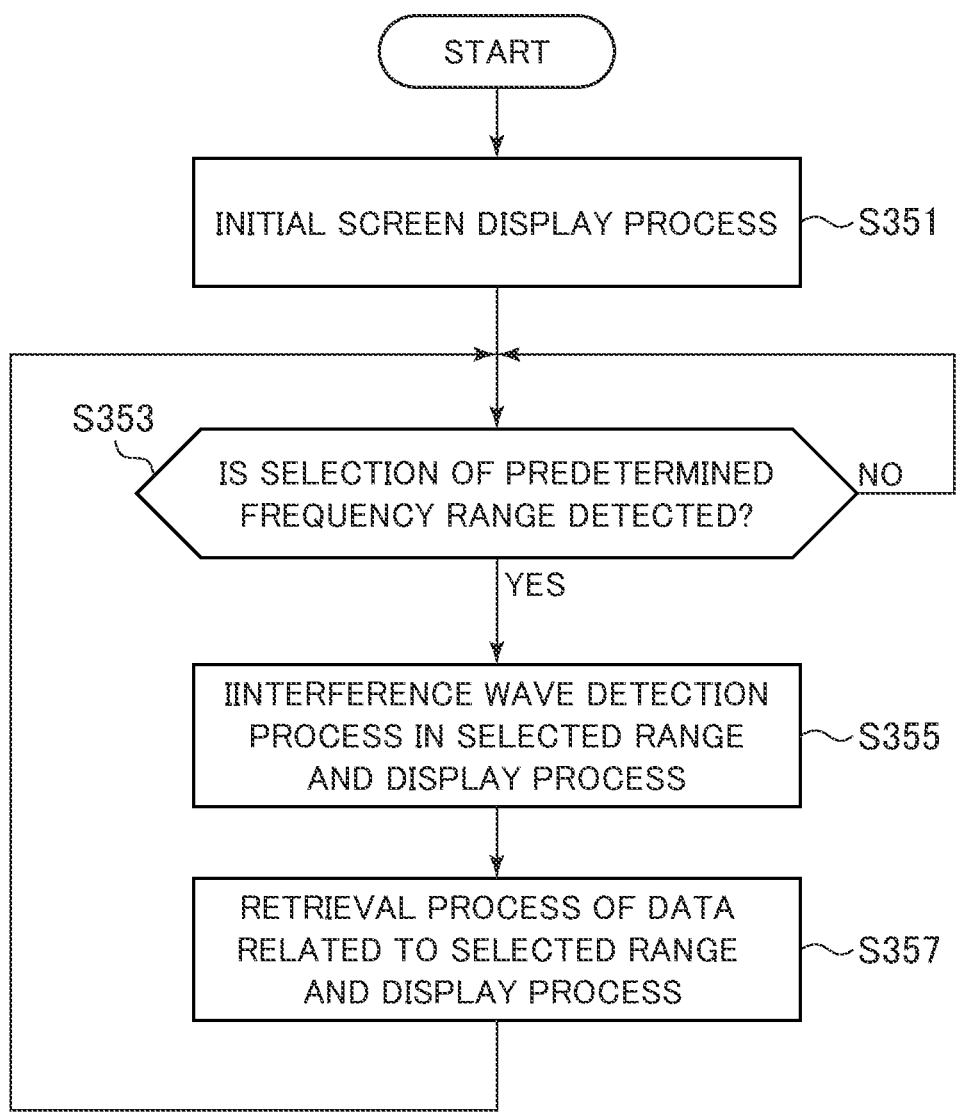
FIG. 5 is a detailed flowchart of a selected range retrieval mode.

When the first mode signal is detected, a selected range retrieval mode is executed (S35). FIG. 5 is a detailed flowchart of the selected range retrieval mode. As apparent from the figure, when the process starts, the data to be analyzed is read and a process of displaying an initial screen is performed (S351).

Figure 6:
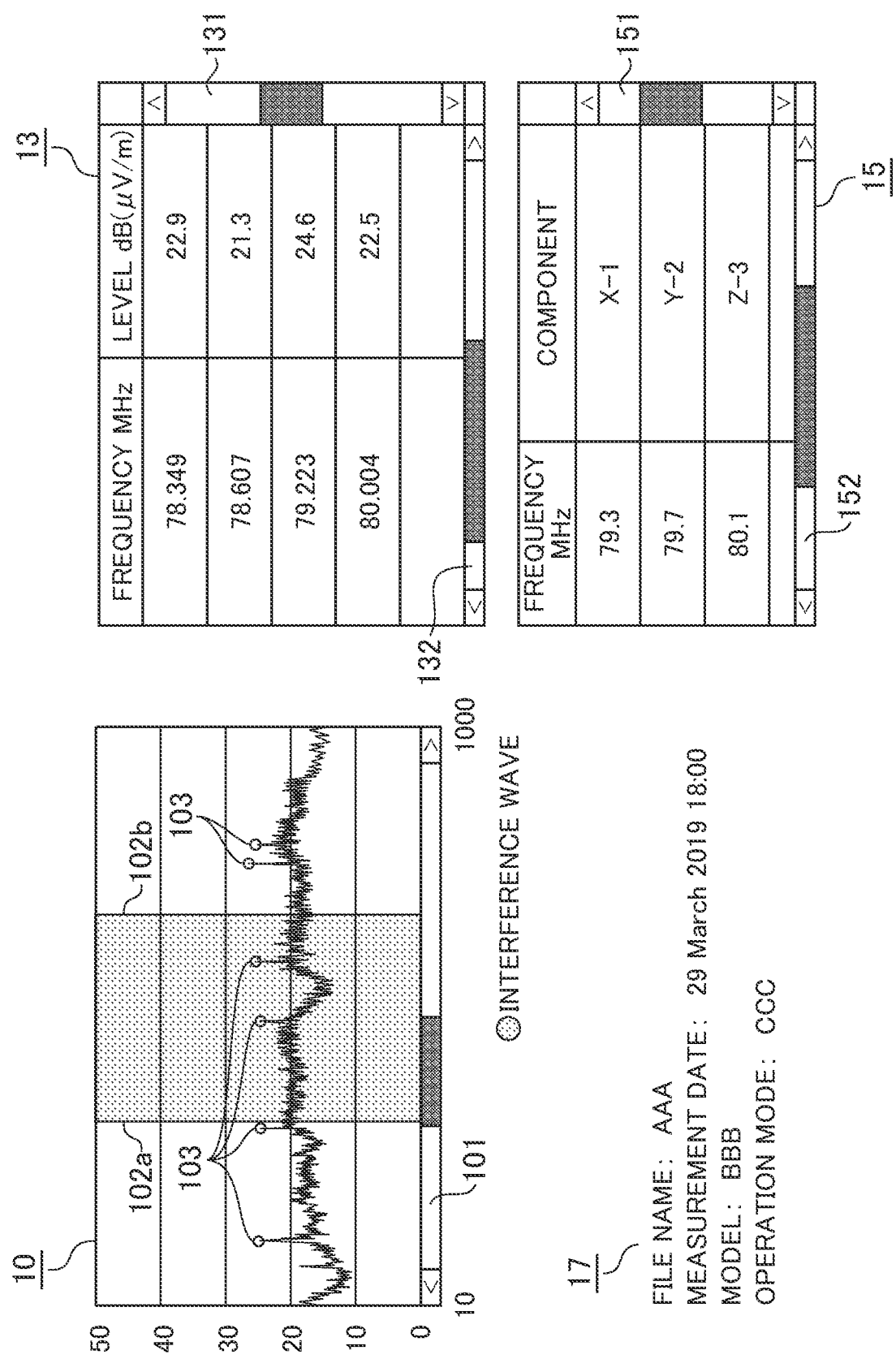
FIG. 6 is an example of a screen view regarding the selected range retrieval mode.

FIG. 6 is an example of a screen view illustrating the selected range retrieval mode to be displayed. As apparent from the figure, a target graph display area 10 showing a frequency domain waveform of the data to be analyzed is disposed in an upper left portion of the screen. A frequency domain waveform (i.e., a frequency spectrum) of the data to be analyzed is displayed on the target graph display area 10, and the frequency spectrum includes a plurality of peak waveform portions 103 having an amplitude of a predetermined value or more.

The target graph display area 10 is configured to be capable of selecting on the graph display area, and for example, a reference frequency domain (a shaded domain in the figure) can be set by selecting a lower frequency 102a and an upper frequency 102b. The horizontal axis of the graph represents frequency, while the vertical axis represents level, in which a slide bar 101 is used so that the display area can be moved in a left and right direction.

A related information presentation area 17 is displayed in a lower left portion of the screen, to display thereon information related to the data displayed on the target graph display area 10. The related information presentation area 17 includes a file name and a measurement date of the data displayed on the target graph display area 10, and the information about a model, an operation mode, and the like of a target product whose data is acquired.

An interference-wave-in-selected-range display area 13 is provided in an upper right portion of the screen. On the interference-wave-in-selected-range display area 13, various pieces of information (e.g., a peak frequency, a peak level, and the like) about interference waves (peak waveform portions having an amplitude of the predetermined value or more in the frequency spectrum) corresponding to the referenced frequency range selected in the target graph display area 10 are displayed. Vertical and horizontal slide bars 131 and 132 are provided in the interference-wave-in-selected-range display area 13, so that the interference waves can be scroll-displayed.

A sample data display area 15 is provided in a lower right portion of the screen. On the sample data display area 15, information about a sample interference wave in the selected range and a component causing the interference wave is displayed. The information is displayed by reading a sample table representing the correspondence between a component and a frequency of an interference wave emitted by the component. Vertical and horizontal slide bars 151 and 152 are provided in the sample data display area 15, so that the sample data including, for example, the interference waves and the like can be scroll-displayed.

As described later, it should be noted that when the initial screen is presented (S351), the reference frequency range is not set, and therefore, no special data is displayed on the interference-wave-in-selected-range display area 13 and the sample data display area 15 until the referenced frequency range is set.

Returning to FIG. 5, when the initial screen display process (S351) is completed, there is performed a process of accepting the selection of a predetermined frequency range (NO in S353). When in this state, a reference frequency range is set by selecting the lower frequency 102a and the upper frequency 102b in the target graph display area 10 in FIG. 6, the reference frequency range is detected as a predetermined frequency range (YES in S353). After the predetermined frequency range is detected, there is performed a process of detecting the interference waves, i.e., the peak waveform portions having an amplitude of a predetermined value or more, which are included in the frequency range, and displaying the detected interference waves on the interference-wave-in-selected-range display area 13 illustrated in FIG. 6 (S355).

Thereafter, there is performed a process of retrieving data related to the interference waves from the sample data, or in the present embodiment, information related to the interference waves from the sample data indicating that the peak frequencies are included in the selected frequency range, and displaying the related information on the sample data display area 15 (S357). As illustrated in FIG. 6, the related information includes, for example, information about components corresponding to the data regarding the retrieved interference waves, and the like. Thereafter, the process of accepting the selection of the predetermined frequency range is performed again (NO in S353). Although not illustrated, the mode is ended by a predetermined interruption process based on the detection of the predetermined end instruction.

According to such a configuration, the interference waves that have occurred in the frequency range in the past can be retrieved from the sample data by specifying the periphery of the interference wave in the target graph showing the frequency domain waveform of the data to be analyzed. In this way, the cause of the interference wave can be specified efficiently.

Additionally, since the information related to the past interference waves retrieved from the sample data can be also checked, the information for assisting in estimating the cause of the interference wave can be obtained, and the accuracy and efficiency of specifying the cause of the interference wave can be improved.

<Second Mode (Similar Interference Wave Retrieval Mode)>

Figure 7:
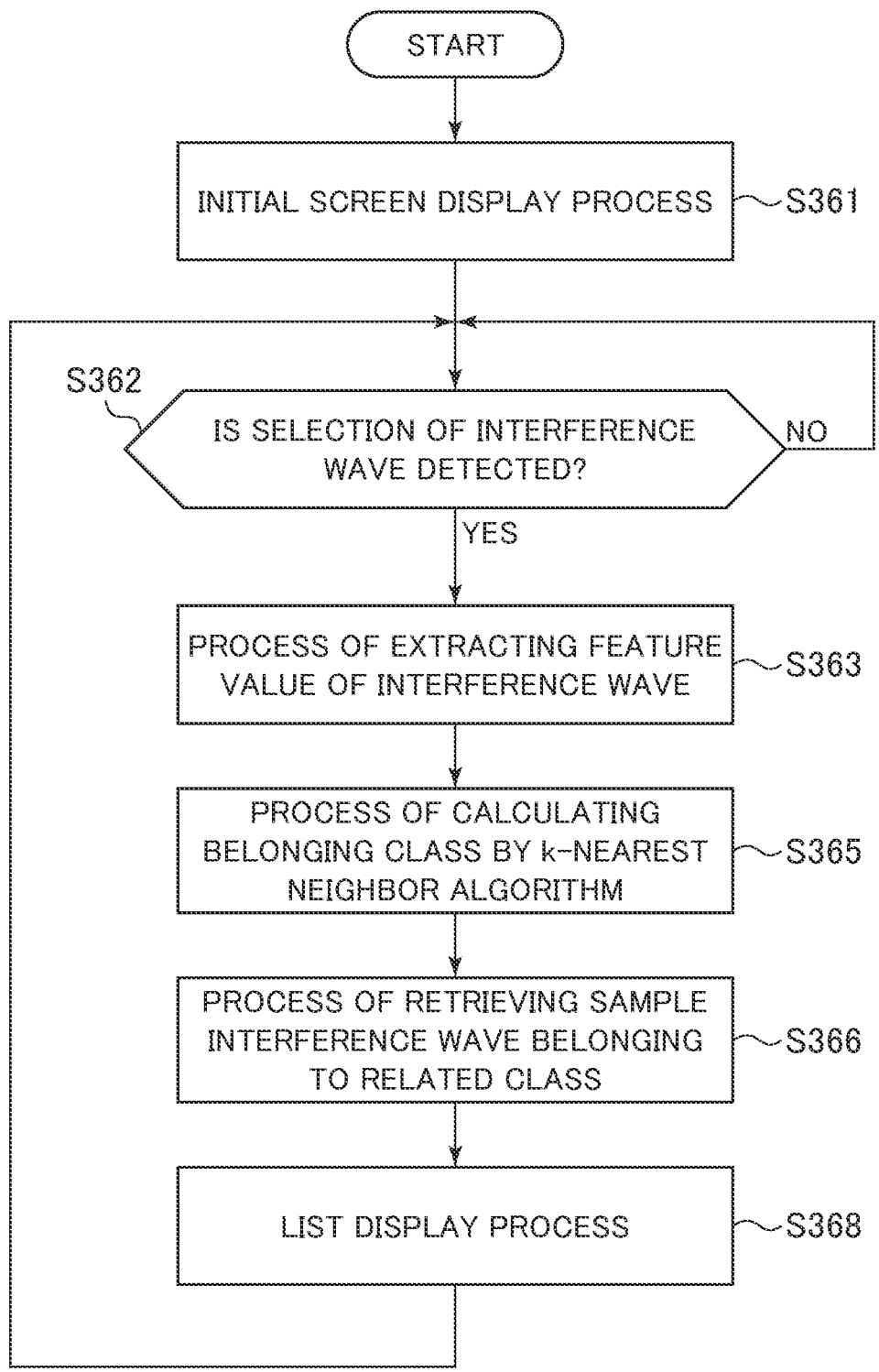
FIG. 7 is a detailed flowchart of a similar interference wave retrieval mode.

When the second mode signal is detected, a similar interference wave retrieval mode is executed (S36). FIG. 7 is a detailed flowchart of the similar interference wave retrieval mode. As apparent from the figure, when the process starts, the data to be analyzed is read and a process of displaying an initial screen is performed (S361).

Figure 8:
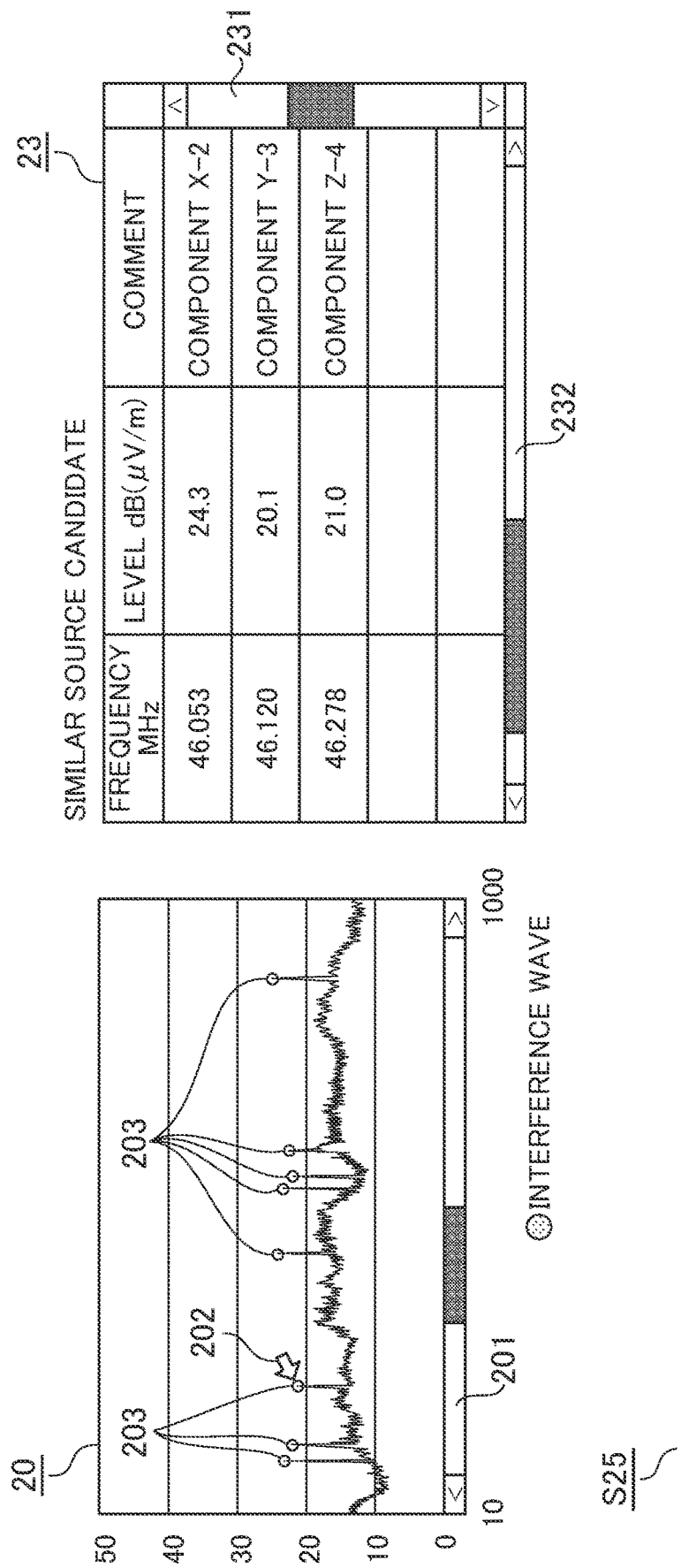
FIG. 8 is an example of a screen view regarding a similar interference wave retrieval mode.

FIG. 8 is an example of a screen view illustrating the similar interference wave retrieval mode to be displayed. As apparent from the figure, a target graph display area 20 showing a frequency domain waveform of the data to be analyzed is disposed in an upper left portion of the screen.

A frequency domain waveform (i.e., a frequency spectrum) of the data to be analyzed is displayed on the target graph display area 20, and the frequency spectrum includes a plurality of peak waveform portions 203 having an amplitude of a predetermined value or more. The peak waveform portion 203 is configured to be selectable as a reference interference wave. The horizontal axis of the graph represents frequency, while the vertical axis represents level, in which a slide bar 201 is used so that the display area can be moved in a left and right direction.

A related information presentation area 25 is displayed in a lower left portion of the screen, to display thereon information related to the data displayed on the target graph display area 20. The related information presentation area 25 includes a file name and a measurement date of the data displayed on the target graph display area 20, and the information about a model, an operation mode, and the like of a target product whose data is acquired.

A sample interference wave display area 23 is provided in an upper right portion of the screen, to display a list of the interference waves retrieved from the sample data, the interference waves being similar to the interference waves which are selected in the target display area 20. On the sample interference wave display area 23, information about the interference waves similar to the interference waves selected in the target display area 20 is displayed, and the information including, for example, a peak frequency of an interference wave, its peak level, an operator's comment assigned to the interference wave, and the like. Vertical and horizontal slide bars 231 and 232 are provided in the sample interference wave display area 23, so that, for example, the sample interference waves and their related information can be scroll-displayed.

As described later, it should be noted that when the initial screen is presented (S361), the reference interference wave is not set in the target graph display area 20, and therefore, no special data is displayed on the sample interference wave display area 23 until the reference interference wave is set.

Returning to FIG. 7, when the initial screen display process (S361) is completed, there is performed a process of waiting for detecting that the interference waves or peak waveform portions 203 are selected in the target graph display area 20 (NO in S362). When, in this state, it is detected that the operator selects the interference waves or the peak waveform portions 203 in the target graph display area 20 (YES in S362), there is performed a process of extracting the feature values related to the interference waves (S363).

In the present embodiment, the feature values include frequency domain feature values and time domain feature values. More specifically, as illustrated in FIG. 9, the frequency domain feature values consist of 10 feature values including a peak frequency (fp) of a peak waveform portion 203, a pair of lower and higher frequencies ($f_{-6L}$, $f_{-6H}$) corresponding to a level lower by 6 dB than a level corresponding to the peak frequency and a width (W-1) between the lower and higher frequencies, a pair of lower and higher frequencies ($f_{-10L}$, $f_{-10H}$) corresponding to a level lower by 10 dB than a level corresponding to the peak frequency and a width (W-2) between the lower and higher frequencies, and a pair of lower and higher frequencies ($f_{-20L}$, $f_{-20H}$) corresponding to a level lower by 20 dB than a level corresponding to the peak frequency and a width (W-3) between the lower and higher frequencies.

On the other hand, as illustrated in FIG. 10, the time domain feature values consist of nine feature values including a minimum value (Min) and a maximum value (Max) of a waveform in the time domain at the peak frequency, a level variation (Max−Min) which is a difference between the maximum value and the minimum value, an average level (Ave_on) in an on state which is a constant continuous level rising state, an average level (Ave_off) in an off state which is the other normal state, a level difference between the on state and the off state, the sum ($\Delta t_{\_H1}+\Delta t_{\_H2}$) of on time widths, the sum ($\Delta t_{\_L1}+\Delta t_{\_L2}+\Delta t_{\_L3}$) of off time widths, and a ratio (($\Delta t_{\_H1}+\Delta t_{\_H2}$)/($\Delta t_{\_L1}+\Delta t_{\_L2}+\Delta t_{\_L3}$)) of the sum of on time widths to the sum of off time widths.

When the process of extracting the feature values (S363) is performed, there is performed a process of calculating a belonging class using the k-nearest neighbor algorithm based on the above-described 19 feature values and the data related to the learned model trained using the k-means clustering in the learning mode process (S2). The k-nearest neighbor algorithm is a classification method based on neighboring training examples in a feature space, and in the present embodiment, when an input is regarded as a feature value, a class to which the input feature value belongs is calculated with reference to k (positive integer) training examples existing near the input feature value.

When the process of calculating the class (S365) is completed, there is performed a process of retrieving, from the sample data, the interference waves belonging to a class related to the calculated class (S366). Here, in the present embodiment, the related class is the same as the calculated class. That is, the interference waves belonging to the same class as the class to which the selected interference wave belongs are retrieved from the sample data.

When the process of retrieving the interference wave (S366) is completed, for example, as illustrated in FIG. 8, there is a process of displaying, on the sample interference wave display area 23, the retrieved sample interference waves and their related information as a list (S368). In an example of the figure, the sample interference waves retrieved from the sample data are listed, the sample interference waves having the respective peak frequencies of 46.053 [MHz], 46.120 [MHz], and 46.278 [MHz]. Additionally, there are displayed the peak levels corresponding to the respective sample interference waves, operator's comments assigned to the interference waves, and the like.

When a list display process (S368) is completed, the process enters a selection standby state of the interference wave again (NO in S362), and the process is repeated again. Although not illustrated, the mode is ended by a predetermined interruption process based on the detection of the predetermined end instruction.

According to such a configuration, since the list of the similar interference waves in the past sample data can be checked by selecting the interference wave on the screen, the cause of the interference wave can be specified efficiently.

Since the sample interference waves similar to a predetermined interference wave can be specified using the learned model obtained by subjecting the sample data to the machine learning process, the interference waves having high likelihood to be relevant can be specified regardless of the level of proficiency or skill of the operator, thereby improving the accuracy and efficiency of the cause estimation.

<Third Mode (Similar Data Retrieval Mode)>

Figure 11:
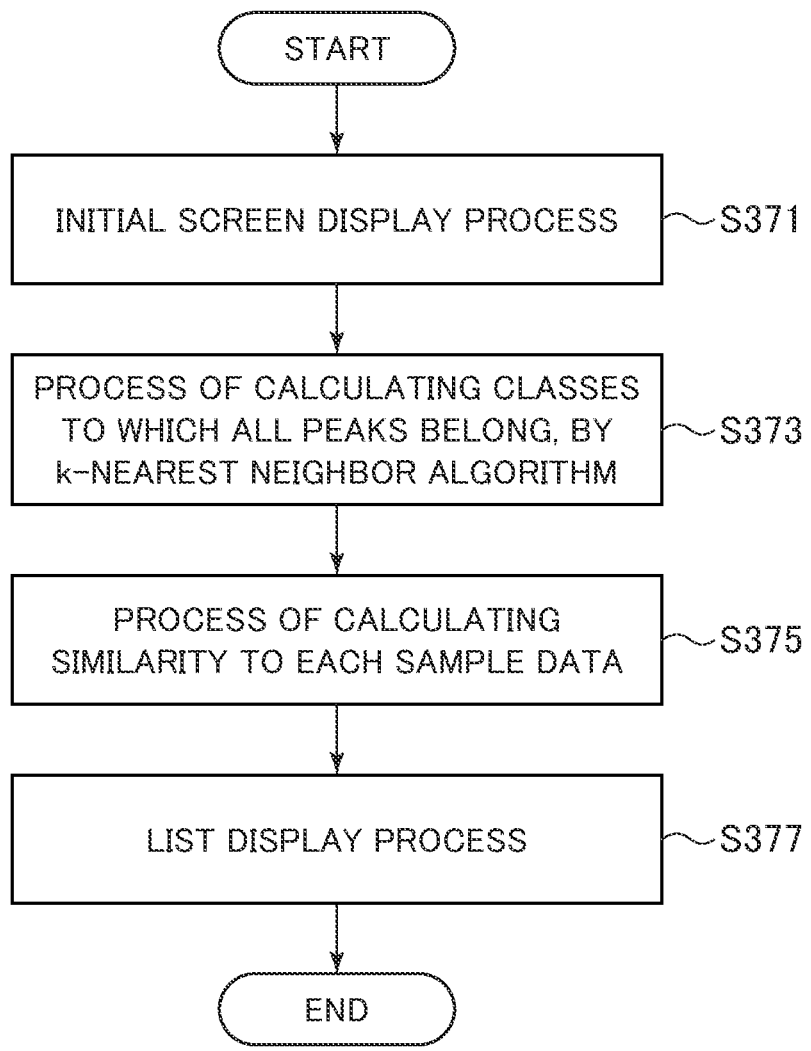
FIG. 11 is a detailed flowchart of a similar data retrieval mode.

When the third mode signal is detected, a similar data retrieval mode is executed (S37). FIG. 11 is a detailed flowchart of the similar data retrieval mode. As apparent from the figure, when the process starts, an initial screen display process is performed (S371).

Figure 12:
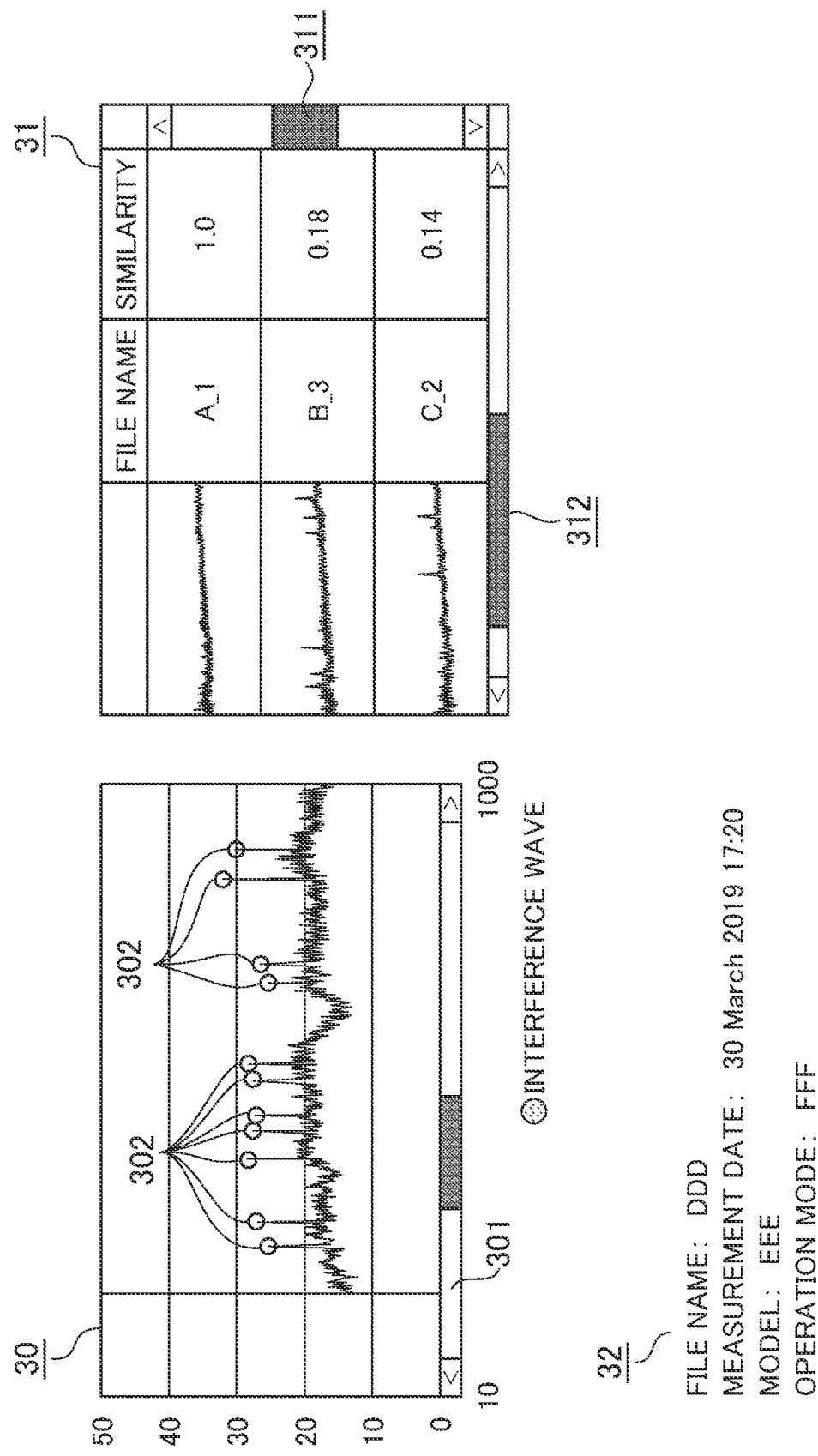
FIG. 12 is an example of a screen view regarding the similar data retrieval mode.

FIG. 12 is an example of a screen view regarding the similar data retrieval mode. As apparent from the figure, a target graph display area 30 showing a frequency domain waveform of the data to be analyzed is disposed in an upper left portion of the screen. A frequency domain waveform (i.e., a frequency spectrum) of the data to be analyzed is displayed on the target graph display area 30, and the frequency spectrum includes a plurality of peak waveform portions 302 having an amplitude of a predetermined value or more. The horizontal axis of the graph represents frequency, while the vertical axis represents level, in which a slide bar 301 is used so that the display area can be moved in a left and right direction.

A related information presentation area 32 is displayed in a lower left portion of the screen, to display thereon information related to the data displayed on the target graph display area 30. The related information presentation area 32 includes a file name and a measurement date of the data displayed on the target graph display area 30, and the information about a model, an operation mode, and the like of a target product whose data is acquired.

A sample frequency spectrum display area 31 is provided in an upper right portion of the screen, to display a list of frequency spectra retrieved from the sample data which have a waveform similar to the waveform of the frequency spectrum displayed in the target graph display area 30. On the sample frequency spectrum display area 31, the frequency spectra having a waveform similar to the waveform of the frequency spectrum displayed in the target graph display area 30 and their related information (e.g., a file name, similarity), and the like, are displayed. Vertical and horizontal slide bars 311 and 312 are provided in the sample frequency spectrum display area 31, so that, for example, the sample frequency spectra and their related information can be scroll-displayed.

As described later, when the initial screen is presented (S371), only the frequency domain waveform of the data to be analyzed is displayed on the target graph display area 30, and the frequency spectra are displayed on the sample frequency spectrum display area 31 after the processes which will be described later.

Returning to FIG. 11, when the initial screen display process (S371) is completed, there is performed a process of calculating a class for each of the interference waves of the frequency spectrum to be analyzed, i.e., all of the peak waveform portions 302 using the learned model obtained in the learning mode process (S2). This can obtain class sequence regarding the interference waves with respect to the frequency spectrum to be analyzed.

When the process of calculating a class is completed (S375), there is performed a process of calculating the similarity between the frequency spectrum to be analyzed and each frequency spectrum according to the sample data based on the obtained class sequence (S375). More specifically, to calculate the similarity, the class sequence is also similarly generated for each frequency spectrum according to the sample data. Next, the class sequence according to the frequency spectrum to be analyzed is compared with the class sequence according to each frequency spectrum according to the sample data, and the similarity is calculated by calculating the degree of coincidence in the classes also in terms of the sequence.

Figure 13:
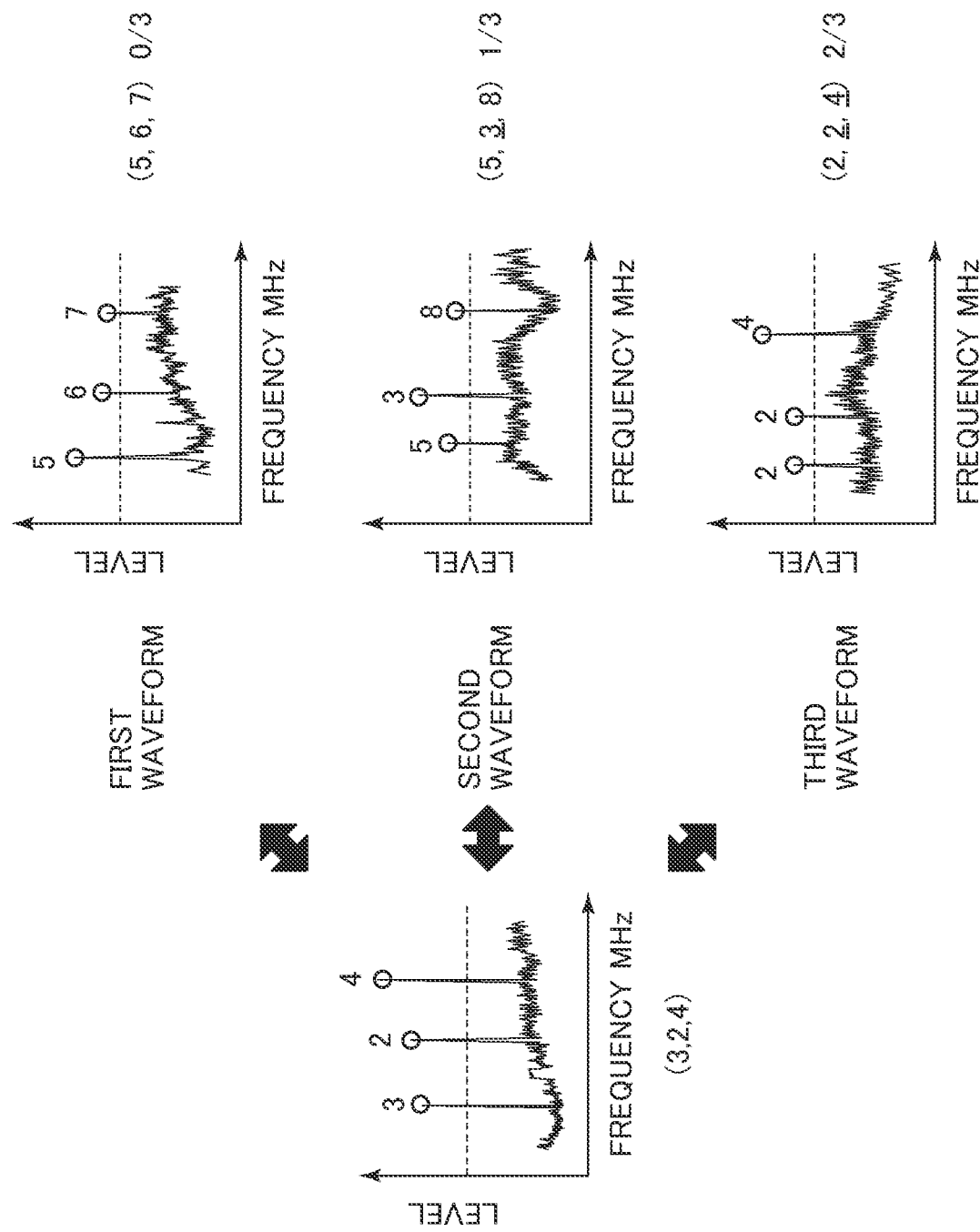
FIG. 13 is an explanatory diagram regarding similarity in class sequence.

FIG. 13 is an explanatory diagram regarding similarity in class sequence. At the center of the left side of the figure, the frequency spectrum to be analyzed is disposed. The frequency spectrum includes three interference waves (peak waveform portions) as an example, and the classes of the interference waves are "3→2→4" in the ascending sequence of frequency. On the other hand, the right side of the figure is divided into an upper part, a middle part and a lower part, and a first waveform (frequency spectrum) is illustratively disposed in the upper part, a second waveform (frequency spectrum) is illustratively disposed in the middle part, and a third waveform (frequency spectrum) is illustratively disposed in the lower part.

In the figure, the first waveform includes the interference waves, and the class sequence thereof is "5→6→7." The second waveform includes the interference waves, and the class sequence thereof is "5→3→8." The third waveform includes the interference waves, and the class sequence thereof is "2→2→4." At this time, when the degree of coincidence in the classes also in terms of the sequence is calculated to calculate the similarity, the similarity to the frequency spectrum to be analyzed is 0% (=0/3) in the first waveform, about 33% (=1/3) resulting from the coincidence of "3" in the second waveform, and about 67% (=2/3) resulting from the coincidence of "2→4" in the third waveform. That is, in this case, the similarity is highest in the third waveform, followed by the second waveform and the first waveform.

Returning to FIG. 11, when the process of calculating the similarity to each sample data (S375) is completed, there is performed a process of reading from the sample data the frequency spectra having the similarity of a predetermined value or more and displaying a list thereof on the sample frequency spectrum display area 31 (S377). Thereafter, the process ends.

Such a configuration makes it possible to refer to the past sample data to which the entire frequency spectrum is similar, thereby enabling diversified cause estimation of the interference wave.

<Fourth Mode (Keyword Retrieval Mode)>

Figure 14:
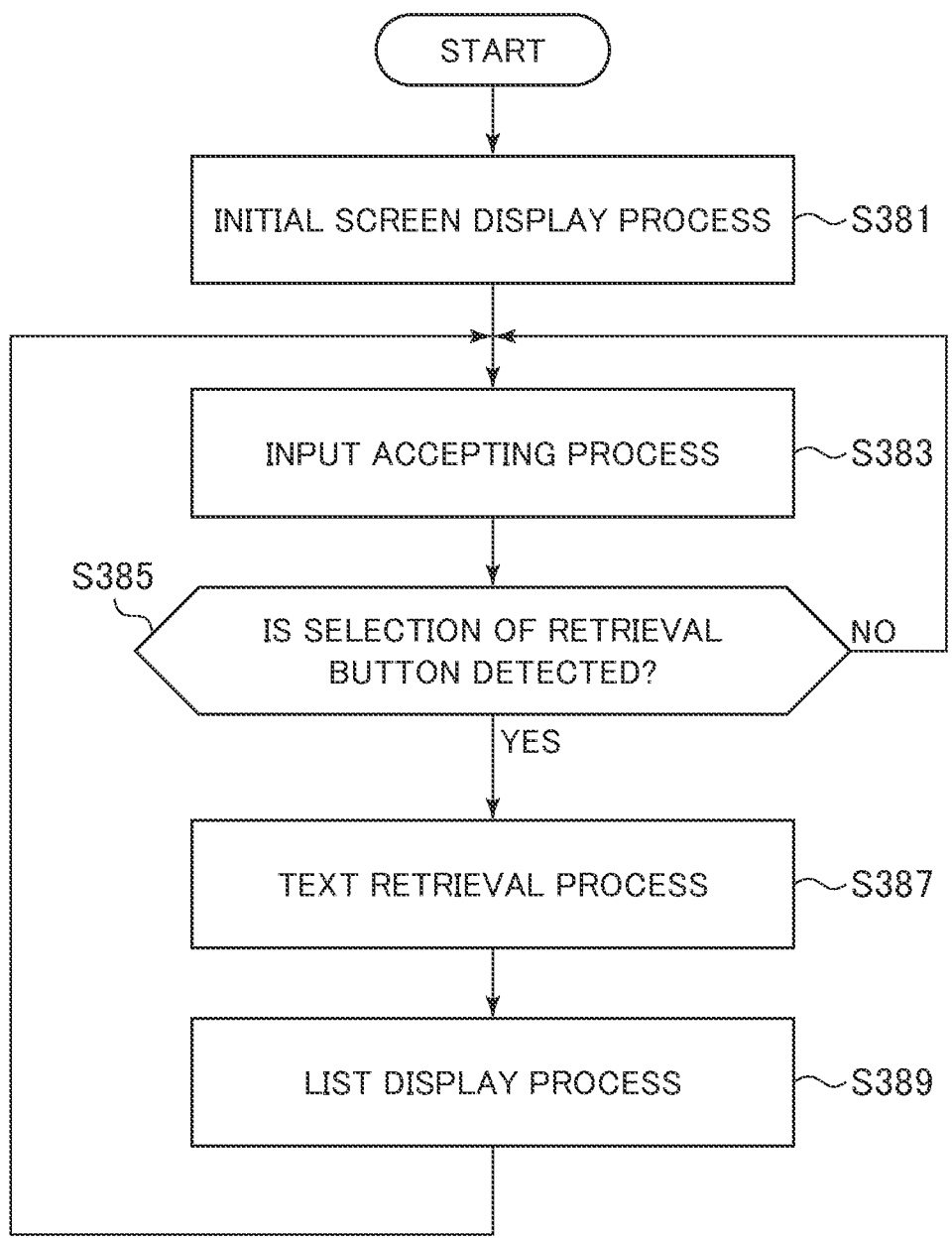
FIG. 14 is a detailed flowchart of a keyword retrieval mode.

When the fourth mode signal is detected, a keyword retrieval mode is executed (S37). FIG. 14 is a detailed flowchart of the keyword retrieval mode. As apparent from the figure, when the process starts, an initial screen display process is performed (S381).

FIG. 15 is an example of a screen view regarding the keyword retrieval mode. As apparent from the figure, a rectangular keyword input area 40 in which characters can be input is provided in an upper portion of the screen. A retrieval process execution button 43 is provided at a lower right portion of the keyword input area 40 and is configured to execute the retrieval process, which will be described later, by the selection of the retrieval process execution button 43.

Furthermore, a retrieval result display area 45 is provided below the retrieval process execution button 43. As described later, on the retrieval result display area 45, a list of data (a waveform of a frequency spectrum, a file name, a measurement date and time, an operation mode, an evaluation purpose, a file comment) obtained through text retrieval based on the keywords input in the keyword input area 40 is displayed. A vertical slide bar 451 is provided in the retrieval result display area 45, so that the display area can be slid in an up and down direction.

As described later, it should be noted that when the initial screen is presented (S381), the retrieval result is not displayed on the retrieval result display area 45, and therefore, no retrieval result is displayed until the retrieval and list display process is performed.

Returning to FIG. 14, when the initial screen display process (S381) is completed, there is performed a process of accepting the text input to the keyword input area 40 (S383).

The acceptance process can be freely performed until the retrieval process execution button 43 is selected (NO in S385). Thereafter, when the retrieval process execution button 43 is selected by the operator (YES in S385), there is performed a process of retrieving the data that meets the retrieval conditions, from the sample data according to the input keywords. The text retrieval process can be performed using various known methods, and the retrieval may be performed based on the input keywords themselves, or the retrieval character string may be further extracted from the input keywords based on predetermined input rules and retrieved.

For example, in an example of FIG. 15, "Model=="x098" & Operation mode=="22uu"" is displayed as the input text. This means instructing to retrieve, from the sample data, the data including a character string of "x098" in an item "Model" and a character string of "22uu" in an item "Operation mode." Thereafter, there is performed a process of retrieving the data that meets the retrieval conditions, from the sample data, based on their character strings.

When the text retrieval process (S387) is completed, there is performed a process of listing the retrieved data to display the list on the retrieval result display area 45 (S389). The data includes, for example, a file name of the data, a measurement date and time, a model of a product to be measured, an operation mode, an evaluation purpose, a comment assigned to the past file, and the like. When the list display process (S389) is completed, the process returns to an acceptance state of the text input again (S385, NO in S385), and is repeated. Although not illustrated, the mode is ended by a predetermined interruption process based on the detection of the predetermined end instruction.

According to such a configuration, inputting keywords enables the data matching the keywords to be read from the sample data, whereby measures against the interference wave can be taken efficiently.

2. Modification Example

The present disclosure can be variously modified, other than the above-described embodiment.

In the above-described embodiment, a single hardware configuration is exemplified as the related interference wave presentation device 100, however the present disclosure is not limited to this embodiment, and various known hardware configurations can be adopted. Accordingly, a system may be formed using a plurality of devices, or the function may be split. For example, the storage unit may be in a form of an independent memory storage, to communicate with the related interference wave presentation device 100. Alternatively, devices or units may communicate with one another through the network such as LAN or WAN.

In the above-described embodiment, the k-means clustering and the k-nearest neighbor algorithm are used as the machine learning methods. However, the present disclosure is not limited to such an embodiment various known machine learning methods can be used. For example, the neural network (e.g., Deep Learning or the like) may be used, or a support vector machine or the like may be used.

In the above-described embodiment, the similarity is calculated by the coincidence in the class sequence. However, the present disclosure is not limited to such a configuration, and various known similarity calculation methods can be used. For example, the correlation coefficient between the two waveforms may be used. Additionally, the similarity may be calculated using the total sum of distances between the waveforms.

In the third mode in the above-described embodiment, only the simply similar frequency spectra are presented based on the sample data, however the present disclosure is not limited to such a configuration. Accordingly, for example, the frequency spectra presented as the similar spectrum are selected to thereby be displayed while being superimposed on the target graph display area 30. According to such a configuration, the similarity between the waveforms can be checked visually. This can improve the efficiency of work of specifying the cause of the interference wave.

INDUSTRIAL APPLICABILITY

The present disclosure can be used at least in the industry field of manufacturing devices for assisting taking measures against interference waves for electronic devices.

REFERENCE SIGNS LIST

1 Control unit
2 Storage unit
3 I/O unit
4 Input unit
5 Display control unit
6 Audio output unit
7 Communication unit
100 Related interference wave presentation device

What is claimed is:

1. A related interference wave presentation device, comprising:
    class specifying processor circuitry configured to specify a class to which a reference interference wave, which is a referenced interference wave, belongs, using a learned model generated by machine learning of sample data including interference waves to specify a class to which an interference wave belongs based on feature values of the interference wave;
    related interference wave information generating processor circuitry configured to retrieve the sample data based on the class to which the reference interference wave belongs and generate related interference wave information which is information about a related interference wave; and
    a presentation controller configured to perform control to present the related interference wave information in part or in whole, and
    wherein the feature values include frequency domain feature values which are feature values in a frequency domain and time domain feature values which are feature values in a time domain.

2. The related interference wave presentation device according to claim 1, wherein
    the frequency domain feature values include at least a peak frequency of one peak waveform portion in a frequency spectrum, and a pair of lower and higher frequencies corresponding to a level lower by a predetermined value than a level corresponding to the peak frequency.

3. The related interference wave presentation device according to claim 2, wherein
    the pair of lower and higher frequencies are a pair of lower and higher frequencies corresponding to different levels lower than the level corresponding to the peak frequency.

4. The related interference wave presentation device according to claim 1, wherein the time domain feature values include feature values regarding an on level which is a rising level continuing for a predetermined time period and feature values regarding an off level which is a level in other time sections, in a time domain waveform corresponding to a peak frequency at one peak waveform portion in a frequency spectrum.

5. The related interference wave presentation device according to claim 4, wherein
the time domain feature values include a maximum level of the on level, a minimum level of the off level, a level difference between the maximum level and the minimum level, an average value at the on level, an average value at the off level, a level difference between the on level average value and the off level average value, a total time period of the on level state, a total time period of the off level state, and a ratio of the total time period of the on level state to the total time period of the off level state.

6. The related interference wave presentation device according to claim 1, wherein
the related interference wave information further includes associated information regarding an interference wave.

7. The related interference wave presentation device according to claim 6, wherein
the associated information is information regarding a component in which the interference wave is generated.

8. The related interference wave presentation device according to claim 6, wherein
the associated information is information about measures against the interference wave.

9. The related interference wave presentation device according to claim 1, further comprising:
keyword input accepting processor circuitry configured to accept an input of a keyword; and
keyword retrieval processor circuitry configured to retrieve, from the sample data, related data based on the input keyword.

10. A related interference wave presentation device, comprising:
class specifying processor circuitry configured to specify a class to which a reference interference wave, which is a referenced interference wave, belongs, using a learned model generated by machine learning of sample data including interference waves to specify a class to which an interference wave belongs based on feature values of the interference wave;
related interference wave information generating processor circuitry configured to retrieve the sample data based on the class to which the reference interference wave belongs and generate related interference wave information which is information about a related interference wave;
a presentation controller configured to perform control to present the related interference wave information in part or in whole; and
similarity retrieval processor circuitry configured to retrieve, from the sample data, a frequency spectrum similar to a referenced frequency spectrum based on a predetermined similarity calculation algorithm.

11. The related interference wave presentation device according to claim 10, wherein
the similarity calculation algorithm is an algorithm for calculating similarity between class sequence to which interference waves included in a referenced frequency spectrum belong and class sequence to which interference waves in each frequency spectrum according to the sample data belong.

12. The related interference wave presentation device according to claim 10, wherein
the similarity calculation algorithm is calculated based on a correlation coefficient between a referenced frequency spectrum and the frequency spectrum to be compared.

13. A related interference wave presentation device, comprising:
class specifying processor circuitry configured to specify a class to which a reference interference wave, which is a referenced interference wave, belongs, using a learned model generated by machine learning of sample data including interference waves to specify a class to which an interference wave belongs based on feature values of the interference wave;
related interference wave information generating processor circuitry configured to retrieve the sample data based on the class to which the reference interference wave belongs and generate related interference wave information which is information about a related interference wave; and
a presentation controller configured to perform control to present the related interference wave information in part or in whole, and
wherein the machine learning method is a predetermined clustering method,
wherein the clustering method is k-means clustering, and
wherein the class specifying processor circuitry is configured to specify a class to which the reference interference wave belongs using the k-nearest neighbor algorithm based on a learned model generated by machine learning of the sample data using the k-means clustering and the reference interference wave.

14. A related interference wave presentation device, comprising:
class specifying processor circuitry configured to specify a class to which a reference interference wave, which is a referenced interference wave, belongs, using a learned model generated by machine learning of sample data including interference waves to specify a class to which an interference wave belongs based on feature values of the interference wave;
related interference wave information generating processor circuitry configured to retrieve the sample data based on the class to which the reference interference wave belongs and generate related interference wave information which is information about a related interference wave;
a presentation controller configured to perform control to present the related interference wave information in part or in whole;
a reference frequency spectrum display controller configured to control display of a reference frequency spectrum including the reference interference wave;
frequency range acquiring processor circuitry configured to acquire information regarding specification of a predetermined frequency range in the reference frequency spectrum; and
an interference-wave-in-frequency-range information generator configured to retrieve sample data in the frequency range based on the information regarding the specification of the frequency range and generate information regarding an interference wave included in the frequency range.

15. A related interference wave presentation system, comprising:
- class specifying processor circuitry configured to specify a class to which a reference interference wave, which is a referenced interference wave, belongs, using a learned model generated by machine learning of sample data including interference waves to specify a class to which an interference wave belongs based on feature values of the interference wave;
- a related interference wave information generator configured to retrieve the sample data based on the class to which the reference interference wave belongs and generate related interference wave information which is information about a related interference wave; and
- a presentation controller configured to perform control to present the related interference wave information in part or in whole, and
- wherein the feature values include frequency domain feature values which are feature values in a frequency domain and time domain feature values which are feature values in a time domain.

16. A related interference wave presentation method, comprising:
- specifying a class to which a reference interference wave, which is a referenced interference wave, belongs, using a learned model generated by machine learning of sample data including interference waves to specify a class to which an interference wave belongs based on feature values of the interference wave;
- retrieving the sample data based on the class to which the reference interference wave belongs and generating related interference wave information which is information about a related interference wave; and
- performing control to present the related interference wave information in part or in whole, and
- wherein the feature values include frequency domain feature values which are feature values in a frequency domain and time domain feature values which are feature values in a time domain.

17. A non-transitory computer-readable medium having one or more executable instructions stored thereon, which, when executed by processor circuitry, cause the processor circuitry to perform a related interference wave presentation method, the method comprising:
- specifying a class to which a reference interference wave, which is a referenced interference wave, belongs, using a learned model generated by machine learning of sample data including interference waves to specify a class to which an interference wave belongs based on feature values of the interference wave;
- retrieving the sample data based on the class to which the reference interference wave belongs and generating related interference wave information which is information about a related interference wave; and
- performing control to present the related interference wave information in part or in whole, and
- wherein the feature values include frequency domain feature values which are feature values in a frequency domain and time domain feature values which are feature values in a time domain.

* * * * *